United States Patent
Raiteri

(10) Patent No.: US 6,183,190 B1
(45) Date of Patent: Feb. 6, 2001

(54) METHOD OF STACKING PACKS OF PRINTED CIRCUIT BOARDS AND RELATIVE PACK LOADING AND UNLOADING DEVICE FOR A MACHINE TOOL

(75) Inventor: Angelo Raiteri, Ivrea (IT)

(73) Assignee: Borgotec Technologie per l'Automazione S.p.A., Borgomanero (IT)

( * ) Notice: Under 35 U.S.C. 154(b), the term of this patent shall be extended for 0 days.

(21) Appl. No.: 09/162,641

(22) Filed: Sep. 29, 1998

(30) Foreign Application Priority Data

Oct. 2, 1997 (IT) ............................... T097A0872

(51) Int. Cl.⁷ .................................................. B65G 60/00
(52) U.S. Cl. .................... 414/788.7; 269/54.5; 269/903; 414/792.9; 414/796.6
(58) Field of Search ........................... 29/760, 762, 799; 269/54.5, 900, 903; 414/27, 788.7, 791.2, 802, 908, 792.9, 796.6, 796.7, 796.9

(56) References Cited

U.S. PATENT DOCUMENTS

| 4,770,120 | 9/1988 | Komatsu et al. ................... 118/669 |
| 5,101,546 | 4/1992 | Otani et al. ......................... 29/426.3 |
| 5,109,584 | 5/1992 | Irie et al. ............................... 29/33 P |
| 5,220,715 | 6/1993 | Otani et al. ........................... 29/33 P |
| 5,566,840 | * 10/1996 | Waldner et al. ................. 269/903 X |
| 5,692,286 | * 12/1997 | Barthelemy ........................... 29/423 |
| 5,743,706 | * 4/1998 | Happ et al. ................... 414/788.7 X |
| 5,970,606 | * 10/1999 | Buechele ........................ 269/54.5 X |

FOREIGN PATENT DOCUMENTS

| 297 12 034 U1 | 10/1997 | (DE) . |
| 0 273 086 A1 | 7/1988 | (EP) . |
| 63-31959 | * 2/1988 | (JP) ............................... 414/788.7 X |
| 6-25931 | 2/1994 | (JP) . |

* cited by examiner

Primary Examiner—Janice L. Krizek
(74) Attorney, Agent, or Firm—Sheridan Ross P.C.

(57) ABSTRACT

Each pack has a pair of opposite edges and a pair of locating pins, and is also provided with pairs of holes separated by a distance equal to that between the pins to enable the packs to be stacked in offset manner, with the pins inserted inside the holes of the underlying pack. The loading and unloading device has a loading station and an unloading station located on either side of the worktable; and a transfer device movable between the stations and a fixture on the worktable for clamping the pack for machining. An unpinning mechanism for unpinning the pack has punches which are activated to remove the pins from the pack before the pack is deposited at the unloading station.

26 Claims, 7 Drawing Sheets

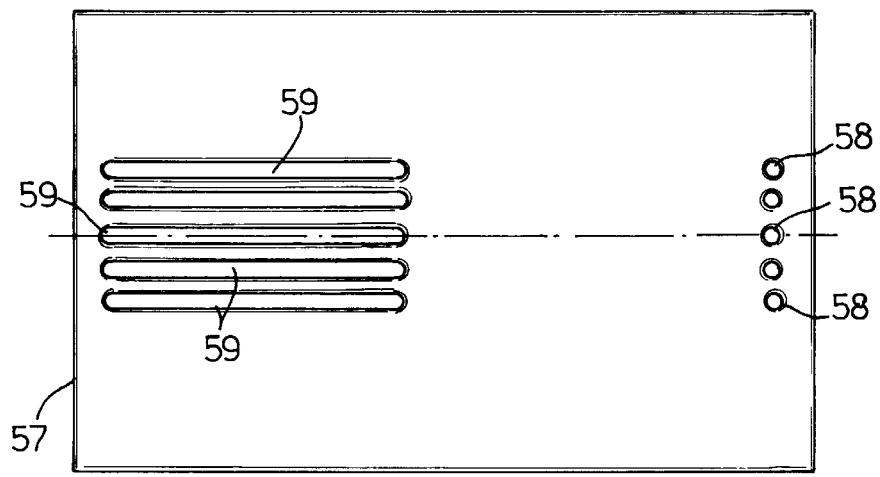
Fig.5
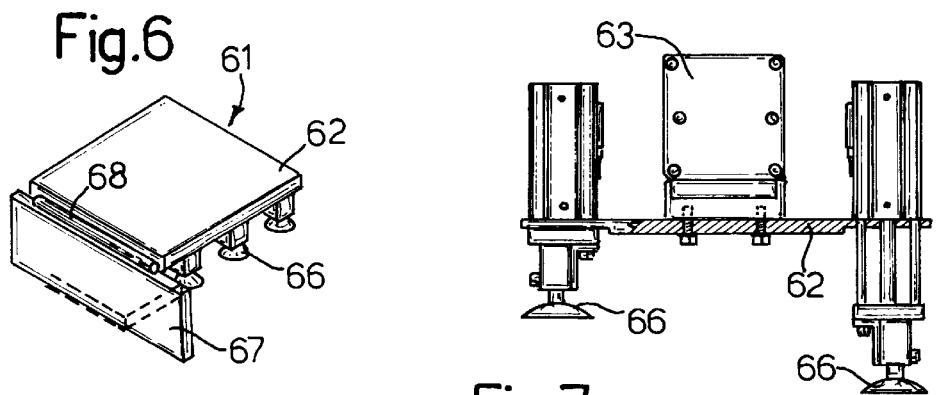
Fig.6
Fig.7
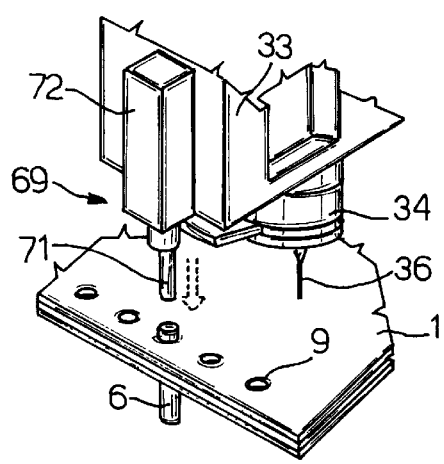
Fig.8

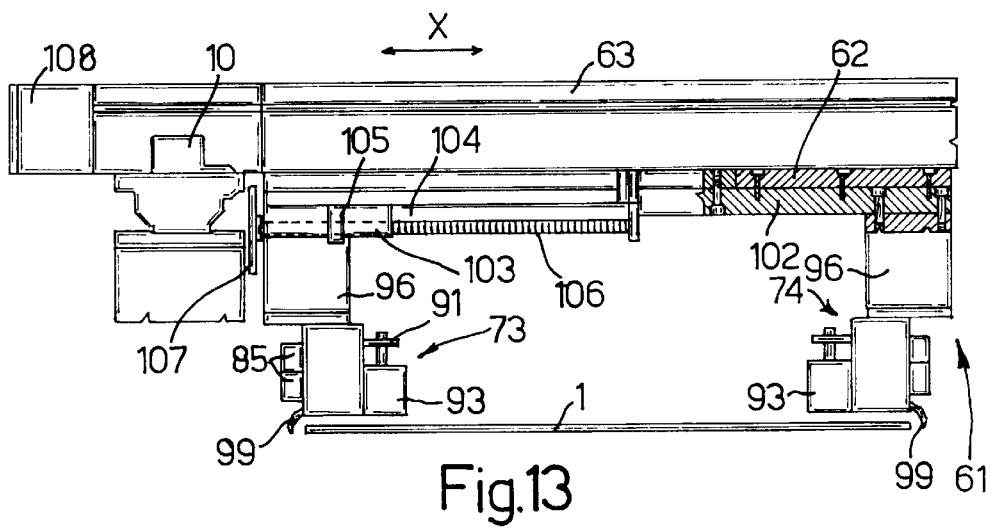
Fig.13
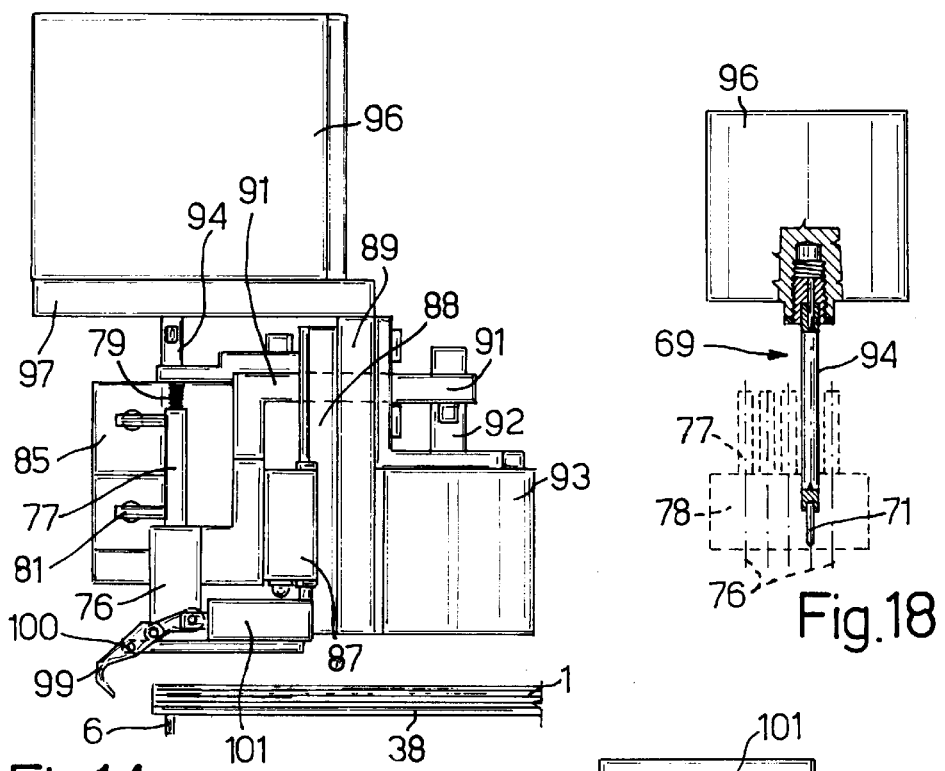
Fig.14
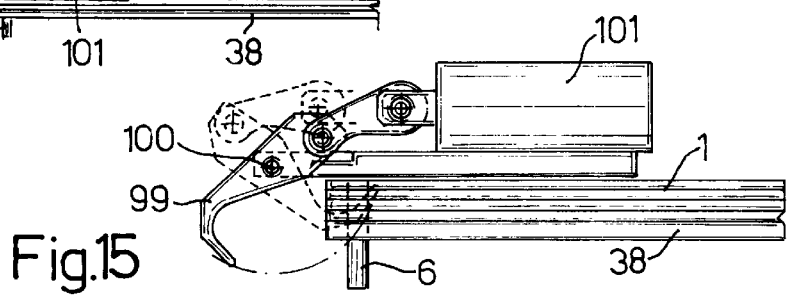
Fig.15
Fig.18

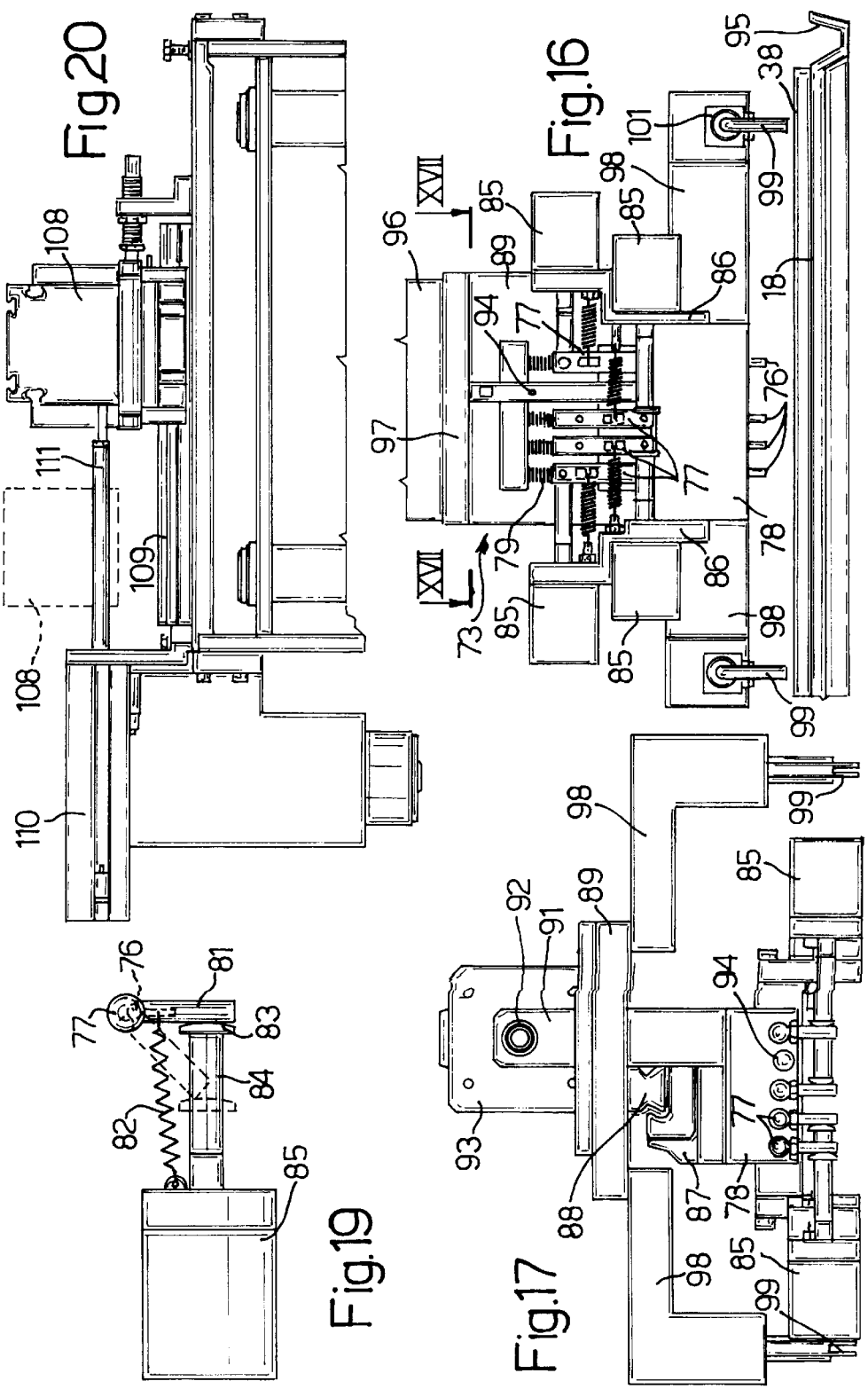

METHOD OF STACKING PACKS OF PRINTED CIRCUIT BOARDS AND RELATIVE PACK LOADING AND UNLOADING DEVICE FOR A MACHINE TOOL

BACKGROUND OF THE INVENTION

The present invention relates to a method of stacking packs of printed circuit boards; to a pack loading and unloading device and pack unpinning mechanism for a machine tool; and to a pack of printed circuit boards stackable using the method according to the invention.

As is known, for machining on a machine tool, packs of printed circuit boards are normally provided with two locating pins along the center line and adjacent to two opposite edges of the pack, which pins project from one face of the pack and are essential for aligning and securing the pack to the table of the machine tool.

The pins, however, prevent the packs from being stacked contacting one another, e.g. for storage, and, to prevent the pins of one pack from damaging the adjacent pack, the packs must be separated by a distance greater than the length of the pins. For this reason, the packs are normally stacked in special trays for protecting the pins and maintaining the necessary distance between the packs. Such trays, however, take up an enormous amount of space, thus increasing the storage cost of the packs.

Moreover, the pins seriously complicate loading and unloading of the packs on and off the machine tool. One known machine with a number of machining heads comprises an automatic pack loading and unloading device, wherein two mechanisms are provided on either side of the machine for vertically moving two racks, one for loading and the other for unloading packs of printed circuit boards.

By means of push actuators associated with each machining head, the packs are moved along the X axis on two guides parallel to the X axis, and which are movable vertically to keep the pins detached from the table during transport; and the packs are then fed in steps to the various machining heads. As a result, the loading and unloading device is extremely complicated, expensive and slow-operating.

Another known machine provides for feeding the machining head by means of a rack having a number of pack supporting trays. The rack is located at the rear of the machine, and the pack is pushed along the Y axis of the tray onto a pack aligning and clamping fixture having a groove for housing the pins.

At each loading and unloading cycle, the device must transfer the machined pack back onto the original tray and remove another pack from the next tray. Moreover, in the case of a number of machining heads, an equal number of racks are required, which means this device, too, is fairly complicated and expensive.

SUMMARY OF THE INVENTION

It is an object of the present invention to provide a pack of printed circuit boards, which may be so stacked as to reduce storage space. It is a further object of the present invention to provide a highly straightforward, reliable pack loading and unloading device for a machine tool, designed to eliminate the aforementioned drawbacks typically associated with known devices.

According to the present invention, there is provided a method of stacking packs of printed circuit boards, wherein each pack comprises a pair of opposite edges, and a pair of locating elements located along the center line of the pack and adjacent to said edges; characterized by providing each pack with at least one pair of holes separated by a distance equal to that between said locating elements; and by placing a further pack on each pack so as to insert the locating elements of said further pack inside the holes of the underlying pack.

The device for loading and unloading packs of printed circuit boards on and off a table of a machine tool comprises a loading station for loading the packs to be machined, and an unloading station for unloading the machined packs; said table comprising at least one aligning and clamping fixture acting on said pair of locating elements to align and clamp a pack of printed circuit boards during machining; and the device being characterized in that a transfer device for transferring said packs is movable between said fixture and at least one of said stations.

BRIEF DESCRIPTION OF THE DRAWINGS

A preferred, non-limiting embodiment of the present invention will be described by way of example with reference to the accompanying drawings, in which:

FIG. 5 shows a plan view of a detail in FIG. 4;

FIG. 6 shows a partial view in perspective of a pack transfer device;

FIG. 7 shows a larger-scale, partially sectioned side view of the FIG. 6 device;

FIG. 8 shows a view in perspective of a pack unpinning mechanism;

FIG. 13 shows a partially sectioned front view of a variation of the pack transfer device;

FIG. 14 shows a larger-scale front view of a detail in FIG. 13;

FIG. 15 shows a larger-scale detail of FIG. 14;

FIG. 16 shows a side view of the FIG. 14 detail;

FIG. 17 shows a section along line XVII—XVII in FIG. 16;

FIGS. 18 and 19 show different scale details of FIGS. 16 and 17 respectively;

FIG. 20 shows a partial side view of the FIG. 13 device.

DETAILED DESCRIPTION OF THE INVENTION

Figure 1:
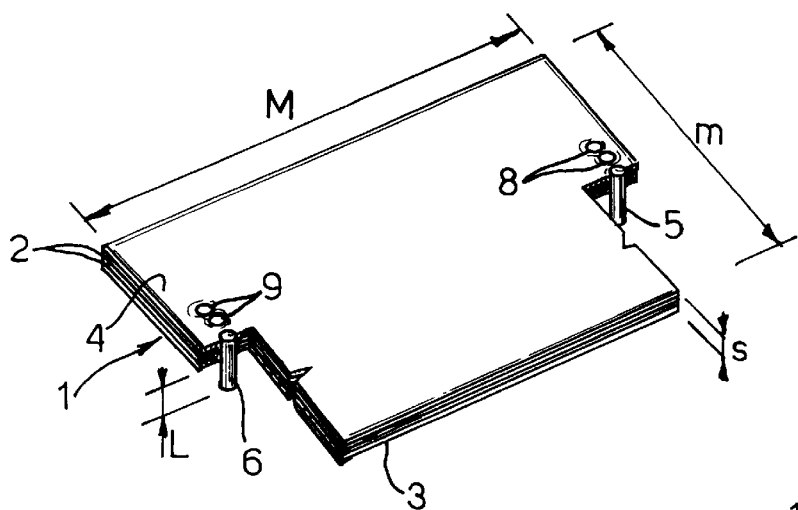
FIG. 1 shows a view in perspective of a pack of printed circuit boards in accordance with the invention.

Number 1 in FIG. 1 indicates as a whole a pack of printed circuit boards 2 as arranged for machining, which normally comprises drilling and milling. Boards 2 are substantially rectangular with a short side or smaller dimension m and a long side or larger dimension M; and pack 1 also comprises an auxiliary bottom board 3 and an auxiliary cover board 4.

Boards 2–4 are connected to one another by a pair of locating elements defined by a pair of cylindrical pins 5 and 6, which are located along the center line A (FIG. 2) of pack 1, adjacent to two edges 7 parallel to short side m, and project downwards by a given length L from auxiliary bottom board 3. Pack 1 is of a thickness S depending on the number and thickness of boards 2.

According to the invention, pack 1 comprises at least one pair of holes 8 and 9 associated with pins 5 and 6 and separated by a distance equal to that between pins 5 and 6. More specifically, on each of the two sides defined by center line A, pack 1 comprises a number of pairs of holes 8 and 9 corresponding to length L of pins 5 and 6 and to thickness S of pack 1.

Figure 2:
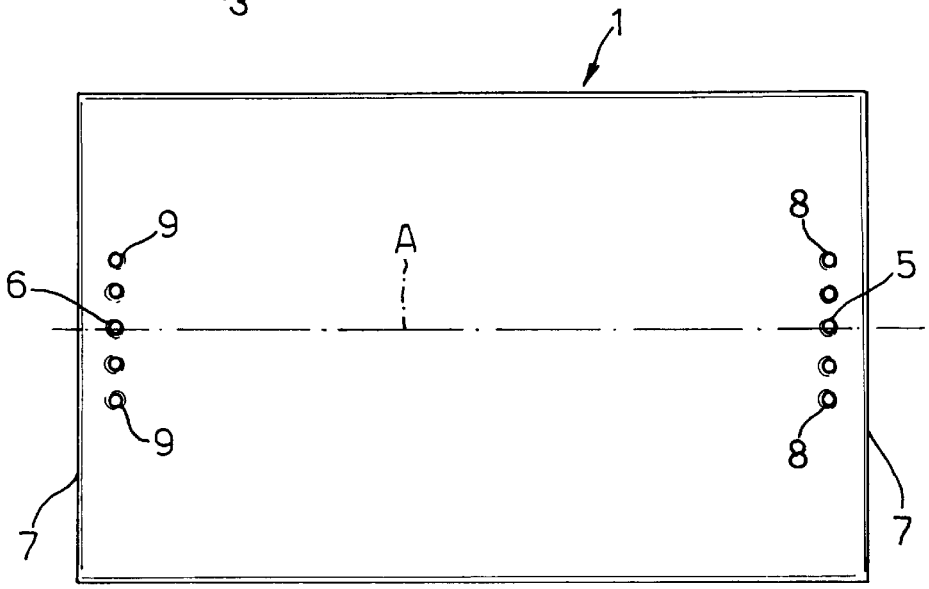
FIG. 2 shows a plan view of the FIG. 1 pack.

Holes 8 and 9 are aligned with respective pins 5 and 6 along two lines parallel to edges 7, and, along each line, are equally spaced with respect to one another and with respect to respective pins 5, 6, so that packs 1 may be stacked in offset manner, with pins 5 and 6 housed inside holes 8, 9 of one or more underlying packs 1. With pins 5 and 6 of a length L ranging between once and twice thickness S, pack 1 advantageously comprises two pairs of holes 8, 9 on each of the sides defined by center line A, as shown in FIGS. 1 and 2.

Figure 3:
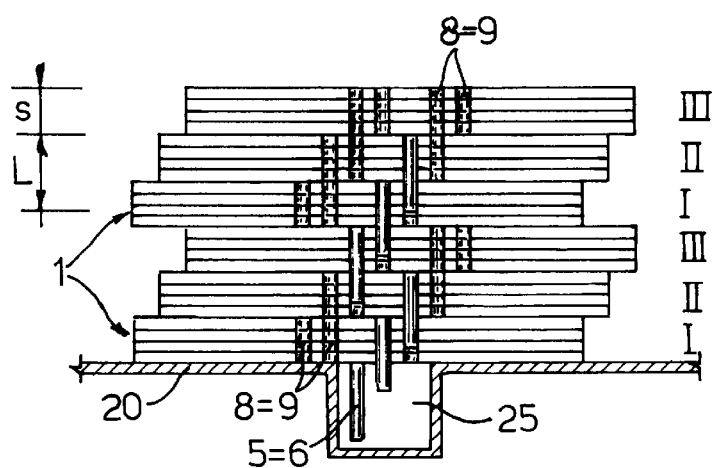
FIG. 3 shows a schematic front view of a number of packs stacked using the method according to the invention.

The method of stacking packs 1 substantially comprises the step of providing the packs with holes 8 and 9; and the step of placing on each pack 1 a further pack 1, with the pins 5 and 6 of the further pack inserted inside holes 8 and 9 of the underlying pack. Packs 1 as shown in FIGS. 1 and 2 may be stacked, for example, on a storage shelf 20 (FIG. 3), by placing a first bottom pack 1 in position I with pins 5 and 6 inside a groove 25 on shelf 20; a second pack 1 is then placed in position II on top of first pack 1, with pins 5 and 6 inserted inside the pair of holes 8 and 9 adjacent to and to the right of (below, in FIG. 2) pins 5 and 6 of first pack 1. The portion of pins 5 and 6 of second pack 1 possibly projecting downwards from first pack 1 are also housed inside groove 25.

By virtue of the equal spacing, along each line, between holes 8, 9 and pins 5, 6 and between the pins themselves, the two lower packs 1 have two pairs of coaxial holes 8 and 9 to receive the next pack 1, which is placed in position III on the second pack 1, with pins 5 and 6 inserted inside the coaxial holes 8 and 9 of the two underlying packs 1. Further packs 1 may thus be stacked cyclically in positions I–III as described above, and, though obviously stacked in offset manner, packs 1 are stacked contacting one another to reduce the amount of space required.

Number 10 in FIG. 4 indicates as a whole a machine tool for machining packs 1, and which comprises a bed 11 having two lateral appendixes 12 (only one shown in FIG. 4) located adjacent to the rear side P of machine 10; appendixes 12 are fitted with two lateral uprights 13, in turn, fitted with a steel crosspiece 14; and machine 10 also comprises a worktable 18, which is moved along a number of guides 19, in a direction hereinafter referred to as the Y axis, by a known numeric-control electric motor (not shown).

More specifically, machine tool 10 comprises two rows of machining heads 33, each row defined by four heads 33; each head 33 comprises a vertical-axis tool-holder spindle 34 for receiving a tool 36, and which is moved along a vertical axis Z by a respective numeric-control reversible electric motor 37; and table 18 comprises two rows of known fixtures 38, each for aligning and clamping a pack 1 during machining, and each comprising a rectangular plate with two short sides 39 parallel to the Y axis.

Each fixture 38 comprises a seat 40 for receiving, for example, locating pin 5 of pack 1; and a groove 41 for receiving the other locating pin 6 of pack 1. The grooves 41 in each row of fixtures 38 are aligned parallel to crosspiece 14, in a direction perpendicular to the Y axis and hereinafter referred to as the X axis; the fixtures 38 in the two rows are arranged adjacent one another to minimize the distance between respective grooves 41; machining heads 33 are carried by a common carriage 44 and so spaced as to correspond with fixtures 38; and carriage 44 is moved along the X axis by a known numeric-control electric motor (not shown).

Machine 10 comprises a device, indicated as a whole by 46, for loading and unloading packs 1, and which comprises a loading station 47 for loading packs 1 for machining onto table 18, and an unloading station 48 for unloading the machined packs 1 off table 18. Stations 47 and 48 are located on either side of machine 10, substantially in front of the two appendixes 12 of bed 11, and are secured to bed 11 in any known manner.

More specifically, each station 47, 48 comprises a supporting structure 49 supporting two columns 51 connected at the top by a crosspiece 52; a lift carriage 53 slides along columns 51, and is powered by a reversible electric motor 54 via a screw-nut screw pair 56; carriage 53 supports a platform 57 for supporting a stack of packs 1; and crosspiece 52 is fitted with an optical sensor 55, 55' on a level with the top surface of fixtures 38. The sensor 55 of loading station 47 detects the top pack 1 on platform 57 to start, stop and control the rotation direction of motor 54, and is so located as to direct a light beam at a given angle, e.g. of 22° 30', with respect to the X axis, for the purpose explained later on.

At least platform 57 of loading station 47 comprises a number of, e.g. five, holes 58 (FIG. 5) equally spaced with the same spacing as holes 8, and for housing pin 5 of a pack 1; and five grooves 59 parallel to crosspiece 14 and for housing pin 6. As will be seen, platform 57 of unloading station 48 does not require holes 58 or grooves 59, but may nevertheless be the same as platform 57 of loading station 47.

Device 46 also comprises a transfer device 61 (FIG. 4) for transferring packs 1, and which is carried by a slide 62 of a known linear actuator 63 defining a straight guide for slide 62. Actuator 63 comprises a toothed belt cooperating with two horizontal-axis pulleys, one of which is rotated selectively by an electric motor 64 carried by crosspiece 52 of loading station 47; and actuator 63 is fitted to both crosspieces 52, and provides for moving slide 62 parallel to crosspiece 14 of machine 10.

Device 61 comprises a group of six suction cups 66 (FIGS. 6 and 7), which are activated to pick up one pack 1 at a time, e.g. off platform 57 of loading station 47. More specifically, suction cups 66 are arranged in two rows of three suction cups 66 each, and are moved telescopically in a given sequence to assist removal and enable gradual placement of pack 1 off and onto the respective support.

Device 61 also comprises an activatable member for pushing one of packs 1 during transfer; which member is defined by a blade 67 hinged to a shaft 68 parallel to the Y axis, and which is rotated by an actuator (not shown) between a horizontal rest position (FIG. 4 and as indicated by the dash line in FIG. 6) and a vertical position (FIG. 6) in which blade 67 engages an edge 7 of a pack 1 (FIG. 12) to push the pack towards unloading station 48.

Finally, each machining head 33 (FIG. 11) comprises a mechanism 69 for unpinning the machined pack 1. Mechanism 69 comprises a punch 71 (FIG. 8) movable parallel to the axis of spindle 34 to remove, each time, a pin 5, 6 from pack 1; punch 71 is activated by a high-speed linear actuator comprising a pneumatic cylinder 72 fitted to head 33; and, at each fixture 38, table 18 comprises a bin (not shown) for collecting the removed pins 5, 6.

Device 46 for loading and unloading packs 1 operates as follows.

To drill a number of packs 1 of printed circuit boards, for example, the operator first removes eight packs 1 off shelf 20 (FIG. 3) and stacks them one at a time by hand on platform 57 of loading station 47 (FIG. 4) set to the raised position. More specifically, the operator first places a first pack 1 on platform 57 (FIG. 5) with pin 5 inside the central hole 58, and pin 6 inside the central groove 59; sensor 55 activates motor 54 of station 47 to lower platform 57 by an amount equal to the thickness of the loaded pack 1; the operator then places a second pack 1 on the first pack 1, with pins 5 and 6 inserted inside holes 8 and 9; and so on, following the method described with reference to FIG. 3.

Figure 9:
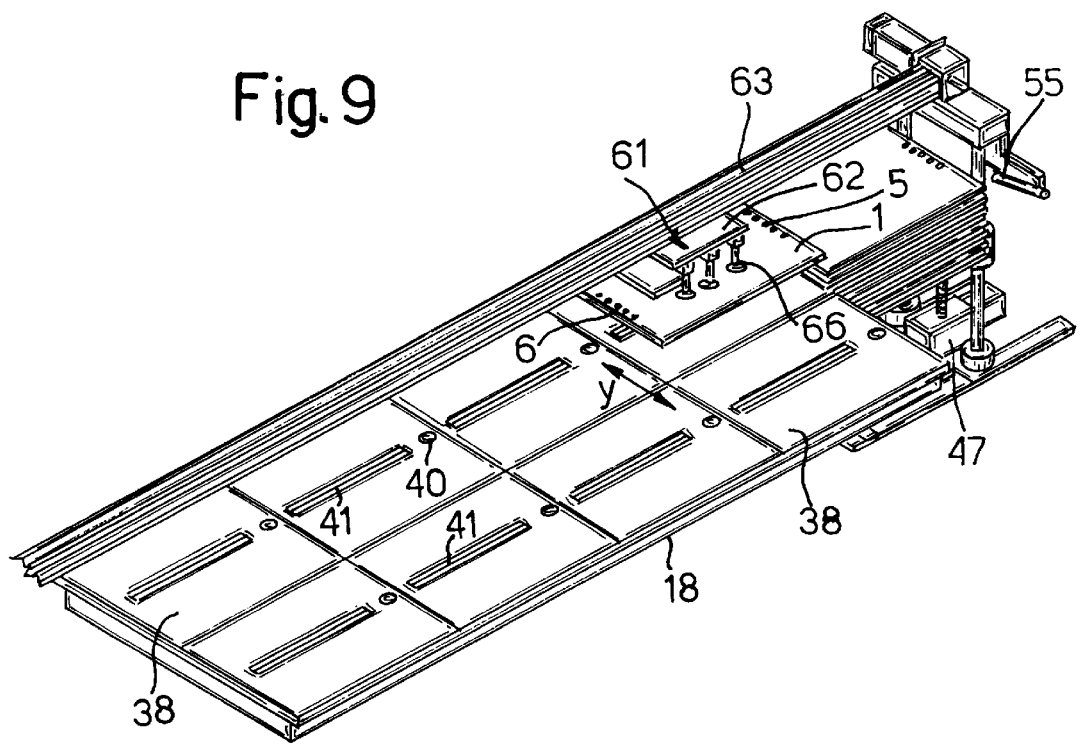
FIGS. 9 and 10 show schematic views in perspective of the FIG. 4 machine at two pack loading stages.
Figure 10:
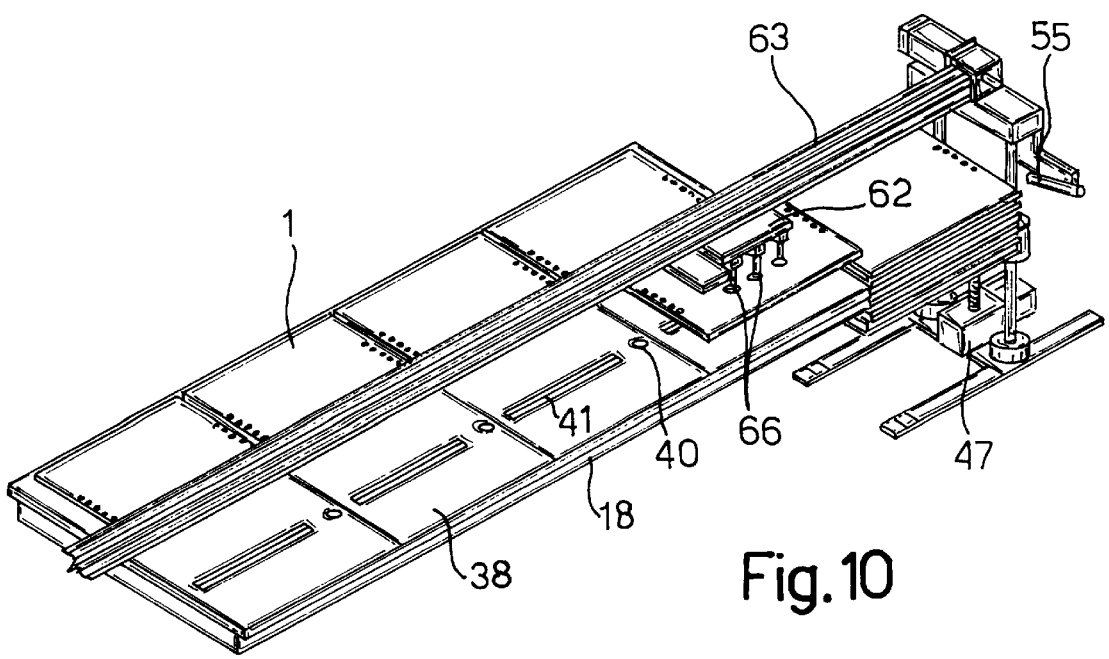

Once eight packs 1 have been stacked at station 47, the operator starts up machine tool 10, which is controlled in known manner by a programmable control unit, which first loads packs 1 sequentially from station 47 onto table 18, starting with the rear row of fixtures 38 and working leftwards from the first fixture 38 on the right (FIG. 9 step), and then going on to the front row of fixtures 38, again working leftwards from the first fixture on the right (FIG. 10 step).

For each pack 1 to be loaded onto the rear row of fixtures 38 (FIG. 9), the control unit operates linear actuator 63 to position cursor 62 over station 47, and then lowers suction cups 66, as described previously, to engage the top pack 1. Suction cups 66 are then raised, and actuator 63 moves cursor 62 to position pack 1 over the required fixture 38. At the same time, the control unit also moves table 18 along the Y axis to align seat 40 and groove 41 of the required fixture 38 with pins 5 and 6 of pack 1.

Sensor 55 detects the passage of pin 5, the delay of which indicates the location, along the Y axis, of pack 1 in the stack. The control unit thus determines the position in which to arrest table 18 to ensure pack 1 correctly engages fixture 38, regardless of the transverse position of the pack in the stack at loading station 47.

Finally, the control unit lowers suction cups 66 and cuts of suction to the cups to deposit pack 1 accurately onto fixture 38. To load the front row of fixtures 38 (FIG. 10), the control unit moves table 18 by an amount equal to the distance between the two rows of grooves 41, and the pack 1 loading cycles are repeated as for the rear row.

Figure 11:
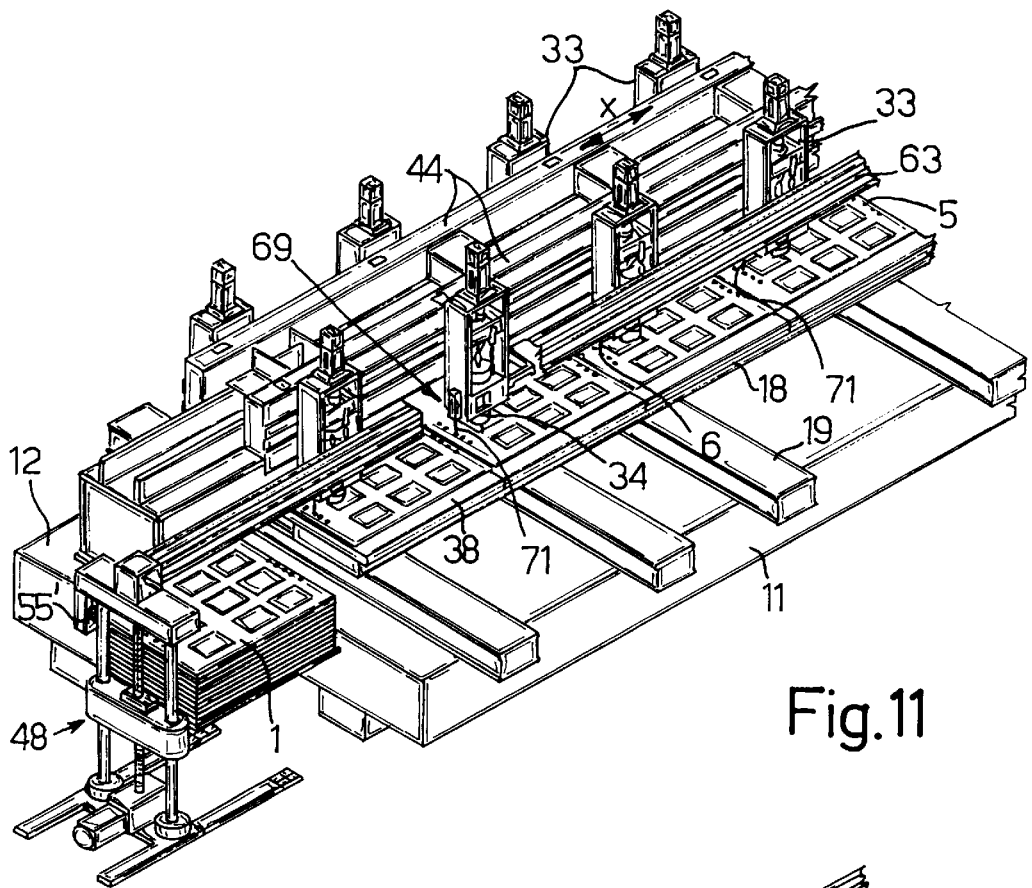
FIG. 11 shows a partial view in perspective of the machine at a pack unpinning stage.
Figure 12:
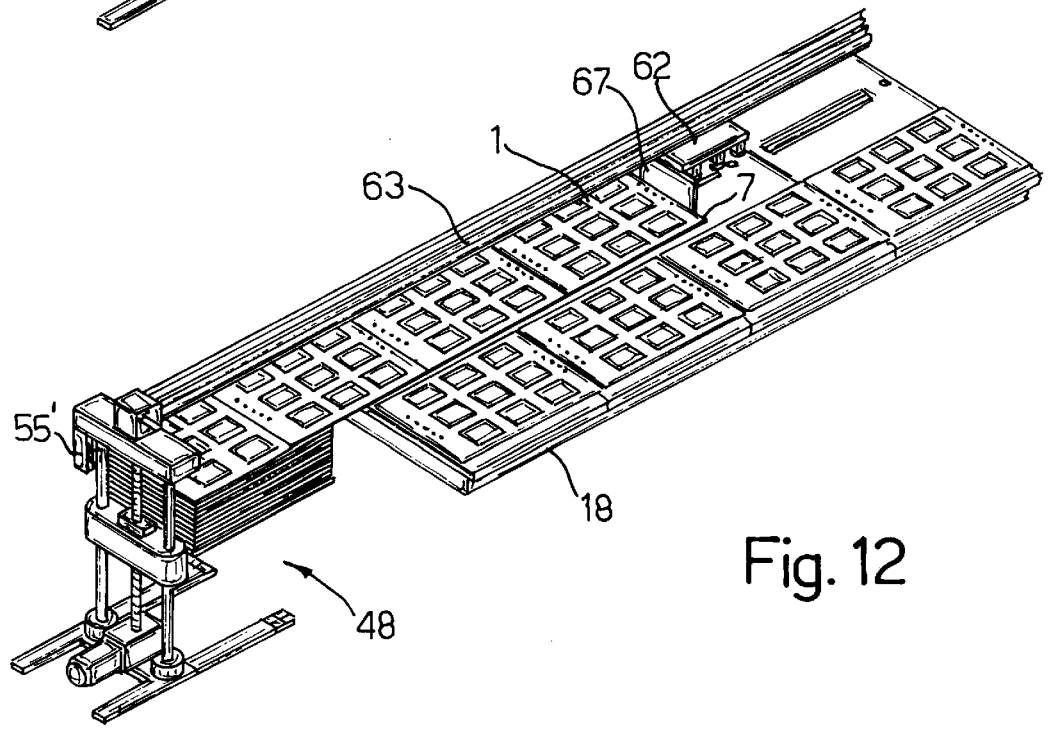
FIG. 12 shows a partial view in perspective of the machine at one pack unloading stage.

Machining of the packs is normally programmed so that boards 2 in each pack 1 contain a number of printed circuits, e.g. nine, as shown in FIGS. 11 and 12; and, after machining, the control unit operates unpinning mechanisms 69 (FIG. 11) to unpin the machined packs 1. To do this, table 18 is first moved to position pins 5 and 6 of the rear row of packs 1 in the plane, parallel to crosspiece 14, containing punches 71; at the same time, carriage 44 is moved along the X axis to align punches 71 with pins 5 of packs 1; and the control unit then operates cylinders 72 (FIG. 8) and hence punches 71 to remove the four pins 5 from the rear row of packs 1.

Carriage 44 is then moved rightwards by a distance equal to the distance between pins 5 and 6 of the packs, and cylinders 72 are again operated to remove pins 6 from the packs in the rear row. Table 18 is then moved rearwards (FIG. 11 position) to position pins 5 and 6 of the front row of packs 1 in the plane containing punches 71, and the above two cycles are repeated to unpin the front row of packs 1.

The control unit then provides for unloading the unpinned packs 1. To do this, platform 57 at unloading station 48 is located on a level with fixtures 38; the control unit operates actuator 63 to position cursor 62 to the right of table 18; table 18 is moved frontwards to align the rear row of packs 1 with cursor 62; and blade 67 is moved into the vertical position.

Actuator 63 is then operated to move cursor 62 leftwards, so that blade 67 engages edge 7 of, and begins pushing, the first pack 1 on the right; the first pack 1, in turn, engages and pushes the second pack 1, and so on, so that the last pack 1 is pushed onto platform 57; and, by means of sensor 55, platform 57 together with the unloaded pack 1 is lowered onto a level with fixture 38 to receive the next pack. All the packs 1 in the row are thus unloaded in one movement of cursor 62, and the above operation is then repeated for the front row of packs 1.

As the actual machining of a number of packs 1 takes a relatively long time, the operator, in the meantime, removes the machined packs 1 from unloading station 48 and stacks a new set of packs 1 for machining at loading station 47. Needless to say, station 47 may be loaded and station 48 unloaded automatically using automatic conveyors or manipulators.

In the FIGS. 13–20 variation, transfer device 61 comprises a pair of pickup assemblies 73 and 74 for picking up pack 1, and which are carried by cursor 62 of linear actuator 63, are aligned along the X axis, are symmetrical with each other, and each comprise four vertical pins 76 (FIG. 16) spaced with the same spacing as holes 8 and 9 (FIG. 1) and so aligned as to simultaneously engage at least two of holes 8 and 9 regardless of the position of pack 1 in the stack.

Each assembly 73, 74 comprises an unpinning mechanism 69, in turn, comprising a punch 71 (FIG. 18), which is located between pins 76 with the same spacing as holes 8 and 9, and which acts on respective pin 5, 6 to unpin the machined pack 1. More specifically, and as shown in FIG. 18, punch 71 is located with one pin 76 to the right and three to the left.

As both assemblies 73 and 74 are perfectly identical, reference is made in the following description to the lefthand assembly 73 only. Each of pins 76 is fitted eccentrically to a pin 77 (FIG. 19) which rotates inside a seat on a body or block 78 of assembly 73. Each pin 77 also slides a given distance inside the seat on block 78, and is pushed downwards by a compression spring 79.

Each pin 77 is integral with a lateral arm 81, which is normally held by a spring 82 against a flange 83 of the piston rod 84 of a pneumatic cylinder 85; the four cylinders 85 are fitted in pairs to two sides 86 integral with block 78; and each flange 83 normally keeps the respective pin 77 so positioned that pin 76 lies in the plane of the axes of pins 77.

Block 78 is integral with a vertical guide 87 (FIGS. 14 and 17), which slides along a dovetailed guide 88 fitted to a frame 89; and block 78 is also integral with an appendix 91, which extends through an opening in frame 89 and is connected to the vertical piston rod 92 of a pneumatic cylinder 93 fitted to frame 89 and for moving block 78 vertically.

Punch 71 (FIG. 18) is fitted to a further pin 94, which slides inside a seat on block 78 and is moved downwards by a high-speed actuator defined by a pneumatic cylinder 96 fitted to a plate 97 integral with frame 89. To collect pins 5, 6 removed from packs 1, the front edge of table 18 comprises a channel 95 (FIG. 16) extending the whole length of table 18 along the X axis.

Frame 89 also comprises a pair of lateral arms 98, the bottom ends of which are fitted with a pair of levers 99 (FIG. 14). Each lever 99 is hinged to a respective horizontal pin 100, is normally set to the rest position shown in FIG. 14, and is activated by a respective pneumatic cylinder 101 to rotate clockwise and engage the underside of a pack 1.

Cylinder 96 of assembly 74 is fitted to a plate 102 (FIG. 13) in turn fitted to cursor 62; and cylinder 96 of assembly 73 is fitted to a slide 103, which moves along a guide 104 fitted to cursor 62 to adjust the distance between assemblies 73 and 74 according to the length M of pack 1. For which purpose, slide 103 comprises a nut screw 105 engaging a screw 106, which rotates on two supports of cursor 62; and one end of screw 106 is fitted to a handwheel 107 for manually adjusting the distance between assemblies 73 and 74.

Transfer device 61 in the FIG. 13–20 variation operates as follows.

Figure 4:
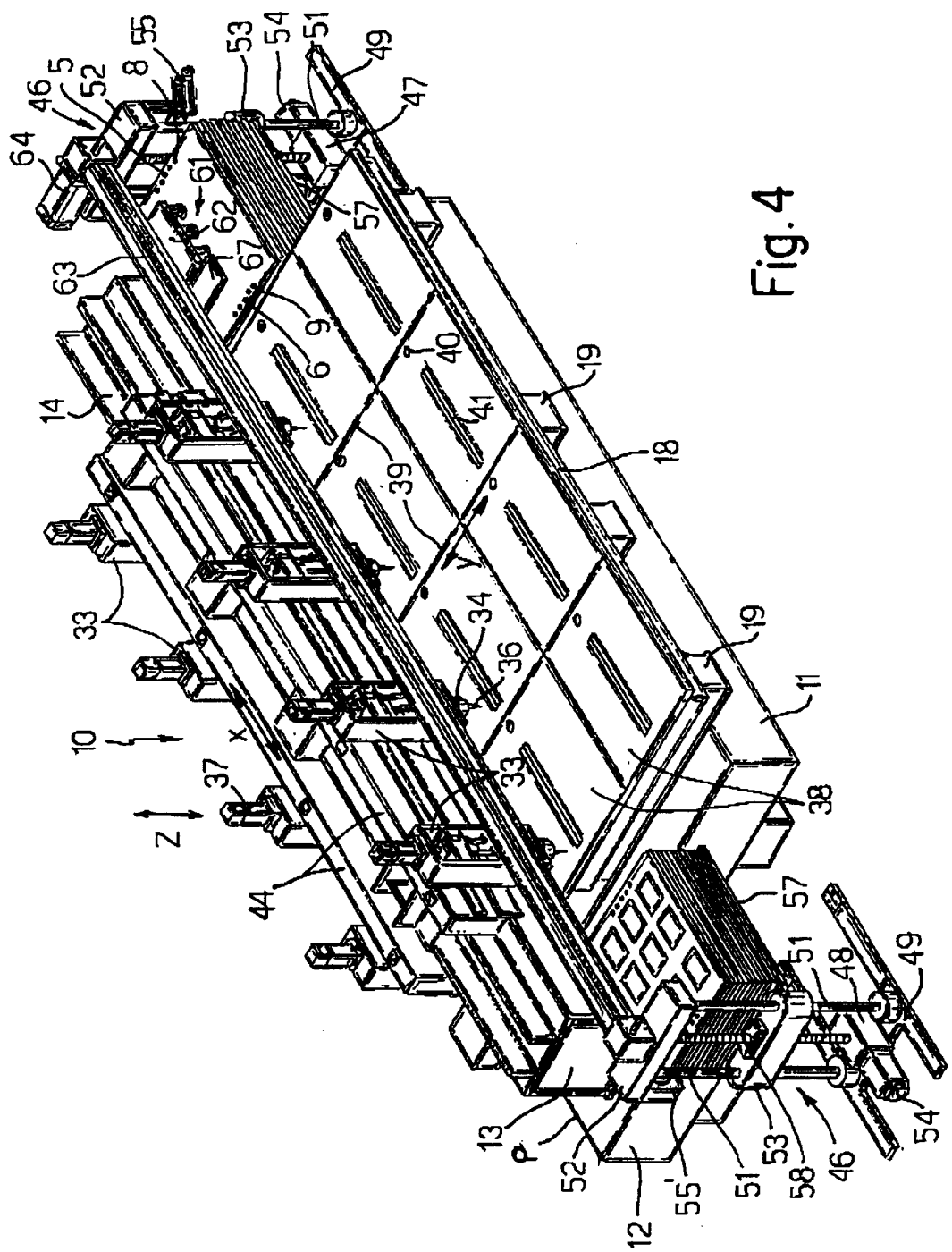
FIG. 4 shows a partial view inn perspective of a machine tool incorporating a pack loading and unloading device in accordance with the invention.

For each pack 1 to be loaded onto a fixture 38, the control unit first operates linear actuator 63 to position cursor 62, as before, over loading station 47 (FIG. 4). The control unit then operates both cylinders 93 (FIG. 13) to lower blocks 78; and, by virtue of springs 79, the pins 76 of assemblies 73 and 74 (FIGS. 14 and 16) engage at least two holes 8 and two holes 9, depending on the position, along the Y axis, of pack 1 in the stack. By virtue of respective springs 79, the pins 76 encountering no holes 8, 9 (FIG. 3) rest simply on the upper surface of pack 1.

The four cylinders 85 (FIG. 19) are then activated, so that springs 82 rotate pins 77, and eccentric pins 76 are forced against the walls of holes 8 and 9. Cylinders 93 are then operated once more to raise blocks 78 together with pins 77 and pins 76, and so raise pack 1 by virtue of the friction between pins 76 and the surface of holes 8 and 9. Cylinders 101 are then operated immediately to rotate levers 99 as shown by the dot-and-dash lines in FIG. 15, and so engage the free ends of levers 99 beneath pack 1, which is thus locked positively to assemblies 73 and 74.

Pack 1 is transferred along actuator 63 as in the previous case, and, to deposit pack 1 onto fixture 38, the control unit first operates cylinders 101 to release pack 1 from levers 99, and then operates cylinders 93 to lower pack 1 onto fixture 38. The control unit then operates cylinders 85 to free pack 1 completely from pins 76, and cylinders 93 are operated once more to raise blocks 78.

For unloading off fixture 38 at unloading station 48 (FIG. 4), pack 1 is clamped and transferred in the same way as for loading; and the packs are unpinned as device 61 is transferred along linear actuator 63. For which purpose, table 18 is positioned with channel 95 (FIG. 16) aligned vertically with the two punches 71 (FIG. 18) of assemblies 73 and 74.

The control unit then operates the two high-speed actuators 96, which, by means of pins 94, push punches 71 downwards to push pins 5 and 6 out while pack 1 is locked positively by levers 99, so that pins 5 and 6 drop down into channel 95.

To reduce the travel of table 18 along the Y axis and prevent interference between the X-axis trajectory of device 61 and heads 33 in the front row (FIG. 4) to access the rear row of fixtures 38, linear actuator 63 comprises two end blocks 108, each of which travels along a respective prismatic guide 109 fitted to the corresponding crosspiece 52 of respective station 47, 48; and each crosspiece 52 is fitted with a pneumatic cylinder 110, the rod 111 of which is connected to the corresponding end block 108 of actuator 63.

To access fixtures 38 in the rear row, device 61 is moved along actuator 63 as in the previous case; upon device 61 reaching the required fixture 38, pickup assemblies 73 and 74 are located on either side of the corresponding head 33 (FIG. 4) in the front row; and cylinders 110 are activated to move actuator 63, parallel to itself, from the continuous-line to the dash-line position in FIG. 20 to bring pack 1 onto the rear-row fixture 38.

The same movement in reverse is performed to remove a pack 1 from a rear-row fixture 38. In this case, during transfer, table 18 (FIG. 16) is positioned with channel 95 beneath punches 71, pack 1 is unpinned in the same way as for the front fixtures 38, and pins 5 and 6 being collected in channel 95.

As compared with known packs and devices, the advantages of the pack stacking method and pack loading and unloading device according to the invention will be clear from the foregoing description. In particular, the storage space required for a given number of packs is greatly reduced; and, for loading and unloading, packs 1 need no longer be arranged individually on special trays.

Moreover, the device for loading the packs onto the machine tool—particularly one featuring a number of machining heads—is simplified by eliminating the rack from which to remove the packs for transfer onto the table. Finally, unpinning packs 1 as soon as they are machined, by means of unpinning mechanisms 69 fitted to heads 33, provides for practically simultaneously unloading a whole row of packs 1 off table 18.

Clearly, changes may be made to the pack stacking method and pack loading and unloading device as described and illustrated herein without, however, departing from the scope of the accompanying Claims. For example, the mechanism for unpinning the machined packs 1 may be eliminated, and the machined packs may be picked up by device 61 and stacked on platform 57 of unloading station 48 using the method according to the invention, and by operating transfer device 61 in the same way, only in reverse, as for loading the packs onto table 18. Moreover, transfer device 61 may be guided along the X axis on a prismatic guide, and may be activated by a different type of actuator. Finally, device 61 may also be movable along the Y axis to allow for any phase displacement of packs 1 at loading station 47, without having to move table 18.

What is claimed is:

1. A device for loading and unloading packs (1) of printed circuit boards on and off a worktable (18) of a machine tool (10); the machine tool (10) comprising a loading station (47) for loading the packs (1) for machining, and an unloading station (48) for unloading the packs (1), each said pack (1) being provided with a pair of locating elements (5, 6); said worktable (18) comprising at least one fixture (38) acting on said pair of locating elements (5, 6) to align and clamp the pack (1) of printed circuit boards during machining; characterized in that a transfer device (61) for transferring said packs (1) is movable between said fixture (38) and at least one of said stations (47, 48).

2. A device as claimed in claim 1, characterized in that each of said stations (47, 48) comprises a platform (57) fitted to a lift carriage (53); a reversible electric motor (54) being provided to move said lift carriage (53) vertically.

3. A device as claimed in claim 2, characterized in that said electric motor (54) is activated by an optical sensor (55) for detecting the respective pack (1), and which is located on a level with said fixture (38).

4. A device as claimed in claim 3, characterized in that said machine tool (10) comprises at least one row machine heads (33) movable in a first direction (X); said work table (18) being movable in a second direction (Y) perpendicular to said first direction (X) and wherein said optical sensor (55) is inclined with respect to said first and second directions (X, Y), and detects one of said locating elements (5, 6) to indicate the location, in said second direction (Y), of said pack (1) in the stack at said loading station (47) and so control displacement of said worktable (18) in said second direction (Y).

5. A device as claimed in claim 1, wherein said locating elements are defined by cylindrical pins (5, 6); characterized by comprising an unpinning mechanism (69) which is activated to remove said pins (5, 6) from the machined pack (1) before the pack is deposited at said unloading station (48).

6. A device as claimed in claim 5, characterized in that said worktable (18) comprises collecting means (95) for collecting the pins so removed.

7. A device as claimed in claim 5, characterized in that said mechanism (69) comprises a punch (71) activated by a high-speed linear actuator (72, 96) to act on each of said pins (5, 6) of the pack (1).

8. A device as claimed in claim 7, characterized in that each of said machining heads (33) comprises a said unpinning mechanism (69) for removing said pins (5, 6) from the pack (1) machined by the machining head; said high-speed actuator comprising a pneumatic cylinder (72) fitted to a respective machining head (33); said punch (71) being movable parallel to the axis of said machining head (33); and collecting means being provided on said worktable (18) to collect the pins (5, 6) so removed.

9. A device as claimed in claim 1, characterized in that said transfer device (61) comprises suction cup means (66) for gripping and retaining said pack (1) during transfer.

10. A device as claimed in claim 9, characterized in that said transfer device (61) comprises a number of suction cups (66), which are activated in a predetermined sequence to assist detachment of a pack (1) from the stack at said loading station (47), and respectively to deposit said pack (1) gradually onto said fixture (38).

11. A device as claimed in claim 9, characterized in that said transfer device (61) also comprises a member (67), which is activated to engage an edge (7) of the pack (1) and push the pack towards said unloading station (48).

12. A device as claimed in claim 11, characterized in that said member is in the form of a blade (67) for simultaneously pushing a row of packs (1); said packs (1) being received successively by said unloading station (48).

13. A device as claimed in claim 11, characterized in that said machine tool (10) comprises at least one row of machine heads (33) movable in a first direction (X); said work table (18) being movable in a second direction (Y) perpendicular to said first direction (X) and wherein said collecting means are defined by a channel (95) along one of the edges of said worktable (18) parallel to said first direction (X).

14. A device as claimed in claim 1, characterized in that said transfer device (61) comprises a pair of pickup assemblies (73, 74), each comprising at least one lift pin (76) for engaging one of said holes (8, 9) adjacent to said pins (5, 6) to lift said pack (1).

15. A device as claimed in claim 14, characterized in that at least one of said assemblies (73, 74) is movable with respect to the other to adjust the distance between the two assemblies according to the length of the packs (1) to be moved.

16. A device as claimed in claim 14, characterized in that each of said lift pins (76) is fitted eccentrically to a rotary element (77); means (85) being provided to rotate each of said rotary elements (77) to force said lift pins (76) against the walls of the holes (8, 9) so engaged.

17. A device as claimed in claim 16, characterized in that each of said assemblies (73, 74) comprises a number of said lift pins (76) aligned to simultaneously engage a corresponding number of said holes (8, 9); each of said rotary elements (77) being rotated by a corresponding pneumatic cylinder (85).

18. A device as claimed in claim 17, characterized in that the lift pins (76) of each assembly (73, 74) are fitted to a body (78) movable along a vertical guide (88) and which is moved by a linear actuator (93).

19. A device as claimed in claim 18, characterized in that each of said assemblies (73, 74) also comprises a pair of levers (99) pivoting about a horizontal axis (100) and which are activated to engage the underside of said pack (1) when the pack is raised.

20. A device as claimed in claim 1, characterized in that said stations (47, 48) are located on opposite sides of said worktable (18); conveying and guiding means (63) being provided to move said transfer device (61) between each of said stations (47, 48) and said worktable (18).

21. A device as claimed in claim 20, characterized in that said conveying and guiding means are straight; at least one of said stations (47, 48) comprising a vertically movable platform (57) for supporting a number of said packs (1) stacked in an offset manner.

22. A device as claimed in claim 21, wherein said packs (1) are stacked in said loading station (47) in an offset manner and wherein said machine tool (10) comprises at least one row of machining heads (33) movable in a first direction (X); said worktable (18) being movable in a second direction (Y) perpendicular to said first direction (X), and comprising a corresponding row of said fixtures (38); characterized in that said stations (47, 48) are located on either side of said machine tool (10); said worktable (18) being moved in said second direction (Y) to enable said transfer device (61) to correctly position on said fixtures (38) said packs (1) stacked in said offset manner.

23. A device as claimed in claim 22, characterized in that said transfer device (61) provides for picking up on pack (1) at a time from said loading station (47); means (64, 110) being provided for moving said transfer device (61) sequentially each time, first along the fixtures (38) in one row and then along the fixtures (38) in the other row.

24. A device as claimed in claim 22, characterized in that said machine tool (10) comprises two parallel rows of said machining heads (33); said worktable (18) comprising two parallel rows of said fixtures (38); and said worktable (18) being moved in said second direction (Y) to enable said transfer device (61) to load and unload said packs (1) on and off both said rows of fixtures.

25. A device as claimed in claim 24, characterized in that said two parallel rows of machining heads (33) are carried by a common carriage (44) traveling along a crosspiece (14) parallel to said first direction (X); said fixtures (38) being so arranged as to align said locating elements (5, 6) parallel to said crosspiece (14).

26. A device as claimed in claim 25, characterized in that said conveying and guiding means (63) is movable along two guides (109) parallel to said second direction (Y); means (110) being provided to move said conveying and guiding means (63) in said second direction (Y).

* * * * *

UNITED STATES PATENT AND TRADEMARK OFFICE
CERTIFICATE OF CORRECTION

PATENT NO.    : 6,183,190 B1
DATED         : February 6, 2001
INVENTOR(S)   : Angelo Raiteri It is certified that error appears in the above-identified patent and that said Letters Patent is hereby corrected as shown below:

<u>Title page,</u>
Item (73), Assignee: Borgotec Tecnologie per L'AutoMazione S.p.A.
Borgomanero (IT)

Signed and Sealed this

Second Day of October, 2001

*Attest:*

NICHOLAS P. GODICI
*Attesting Officer*    *Acting Director of the United States Patent and Trademark Office*